United States Patent [19]

Barry et al.

[11] 4,217,645
[45] Aug. 12, 1980

[54] BATTERY MONITORING SYSTEM

[76] Inventors: George H. Barry, 21225 Saratoga Hills Rd., Saratoga, Calif. 95070; Ernest A. Dahl, 3247 Breaker Dr., Ventura, Calif. 93003

[21] Appl. No.: 33,286

[22] Filed: Apr. 25, 1979

[51] Int. Cl.$^2$ ............................................. G08B 19/00
[52] U.S. Cl. .................................... 364/483; 364/481; 364/580; 340/636; 320/48; 324/426; 324/73 AT
[58] Field of Search ............... 364/481, 483, 579, 580; 340/620, 636, 663; 320/48; 324/73 AT, 426, 434; 204/195 R; 429/92, 93

[56] References Cited

U.S. PATENT DOCUMENTS

| | | | |
|---|---|---|---|
| 3,786,343 | 1/1974 | Ehlers | 324/434 |
| 3,940,679 | 2/1976 | Brandwein et al. | 340/636 |
| 3,971,980 | 7/1976 | Jungfer et al. | 320/48 |
| 4,044,300 | 8/1977 | Dupuis et al. | 324/434 |
| 4,050,717 | 10/1977 | Arnold et al. | 320/48 |

*Primary Examiner*—Charles E. Atkinson
*Assistant Examiner*—Gary Chin
*Attorney, Agent, or Firm*—Richard S. Sciascia; Joseph M. St. Amand; William C. Daubenspeck

[57] ABSTRACT

A system for automatically monitoring a plurality of parameters of a plurality of cells in a lead-acid storage battery system. A transponder means responsive to a frequency pattern corresponding to a digital command is located at each cell to be monitored and includes a plurality of sensors which provide analog signals having an amplitude related to the value of the parameters being monitored. In a remote scanner/display means, a microprocessor generates a digital interrogation command (containing a transponder address, sensor selection, and reply duration commands) which is converted to a frequency pattern and coupled to the transponder. In response to the command, the transponder couples the analog signal from the selected sensor to a voltage-controlled oscillator and the output of the oscillator is coupled for the selected reply duration to the scanner/display means where the frequency of the signal is determined under the control of the processor. The information is stored and averaged within the microprocessor and may be displayed upon operator request and an alarm provided if any parameter of any cell exceeds specified limits.

5 Claims, 16 Drawing Figures

BATTERY MONITORING SYSTEM

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates in general to apparatus for monitoring the status of many-cell storage battery systems and, in particular, to a system for automatically sensing a plurality of parameters of each cell, coupling the data to a remote location, providing an alarm when a cell parameter is not within preselected limits, and displaying the parameters of a selected cell.

Accurate and reliable information about the battery status is required in cases where high-capacity, many-cell battery systems provide operating or emergency power. The lead-acid storage battery system of a submarine is such a case. In these systems, it is desirable to monitor the cell parameters such as operating voltage, operating temperature, electrolyte level, electrolyte specific gravity, and electrolyte level, electrolyte specific gravity, and electrolyte circulation since these parameters indicate problems or potential problems in battery performance.

For example, a higher than normal operating temperature in a cell may indicate an internal short circuit or excessive resistance within intercell connections or internal to the cell. A higher than normal temperature will increase capacitance, local losses, and charging current for a given voltage and, in general, will shorten the life of the battery. If the electrolyte level of the cell drops so low as to expose the surface of the cell electrodes, the cell may be quickly and permanently damaged. On the other hand, if a cell is overwatered prior to charging, the electrolyte may overflow during or following charging with deleterious consequences. It is also desirable to monitor the state of charge in a lead-acid storage cell. One measure of the state of charge (and thus a measure of the cell's condition) is the concentration of sulfuric acid in the cell electrolyte. In large, lead-acid storage cells it is necessary to mechanically circulate the electrolyte to prevent the acid from settling to the bottom, thereby causing the electrolyte to have a non-uniform concentration. Usually an air-lift pump is used to circulate the electrolyte. Since a non-uniform concentration of electrolyte will adversely affect cell longevity, it is desirable to monitor the flow from the lift pump and thus obtain a measure of the circulation of the electrolyte. Depending on the battery system it may be desirable to monitor cell characteristics in addition to or instead of the ones just noted.

Typically, the foregoing parameters have been monitored in the large, many-cell battery systems by visual inspection or manual measurement of the parameters in randomly selected cells. The electrolyte temperature has been usually measured by opening a few random cells and inserting an alcohol thermometer; the state of charge has been inferred from hydrometer readings taken in a similar manner; the electrolyte level has been measured by inserting a glass or plastic tube; the electrolyte circulation has been monitored by observing the total air flow to banks or many cells; and the cell voltage has been monitored by connecting wires to the cell terminals and thence to a remote monitoring location.

In addition to inaccuracies inherent in the manual measurements, the foregoing approach is of limited effectiveness in detecting problems and is also time-consuming. Often the batteries are located in inaccessible areas further complicating the manual monitoring of the battery parameters. Monitoring only a randomly selected portion of the cells has obvious limitations in detecting potential problems and obtaining an accurate knowledge or system operability.

SUMMARY OF THE INVENTION

It is therefore, an object of the present invention to provide improved apparatus for monitoring the status of a many-cell battery system.

Another object of the present invention is to provide apparatus for automatically sensing various parameters of each cell in the battery system and displaying these parameters in a location remote from the battery system.

Another object of the present invention is to provide a battery monitoring system which provides an alarm when a cell parameter is not within preselected limits.

Yet another object of the present invention is to monitor the cell operating voltage, operating temperature, state of charge, and electrolyte level and circulation of each cell in a battery system.

These and other objects are accomplished in a battery monitoring system including a scanner/display unit located at the monitoring location and a plurality of identical cell transponder units located at each cell. The cell transponders are electrically connected together and to the scanner/display unit by a pair of conductors. The scanner/display unit under control of a microprocessor sequentially interrogates the cell transponders. An interrogation command including a transponder address command, a data type command, and a reply duration command is encoded by the scanner/display and coupled to the transponders. When a particular transponder has received its interrogation command, it decodes the command and couples a sensor selected by the data type command to the input of a voltage-controlled oscillator where the sensor data is encoded as the frequency of the oscillator output. The output of this oscillator is transmitted to the scanner/display for a period of time determined by the reply duration command. The scanner/display decodes the signal from the voltage-controlled oscillator and stores and averages the data which may be displayed upon operators request. The scanner/display monitors for out-of-tolerance conditions on the stored data and provides an alarm if any parameter of any cell exceeds specified limits.

Other objects and many of the attendant advantages of the present invention will be readily appreciated as the subject invention becomes better understood by reference to the following detailed description when considered in conjunction with the accompanying drawing wherein:

BRIEF DESCRIPTION OF THE DRAWING

FIG. 4 illustrates the discriminator, address recognizer, and command distributor sections; and FIG. 5 illustrates the sensor selection and data transmission circuitry;

FIG. 6 illustrates the device select decoder section;

FIG. 7 illustrates the interrogation section;

FIG. 8 illustrates the receiver section;

FIGS. 9 and 10 illustrate the display section; and

FIG. 11 illustrates the message generator of the interrogation section;

DESCRIPTION OF THE PREFERRED EMBODIMENT

Figure 1:
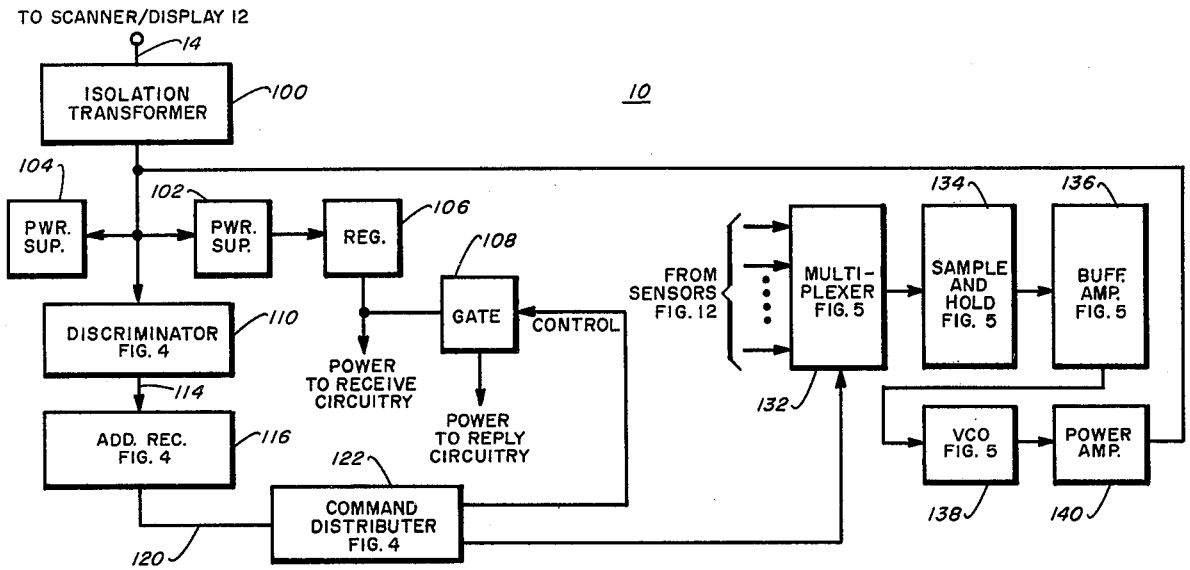
FIG. 1 and FIG. 2 are block diagrams which taken together illustrate the present invention, FIG. 1 illustrating a cell transponder and FIG. 2 illustrating the scanner/display unit.
Figure 2:
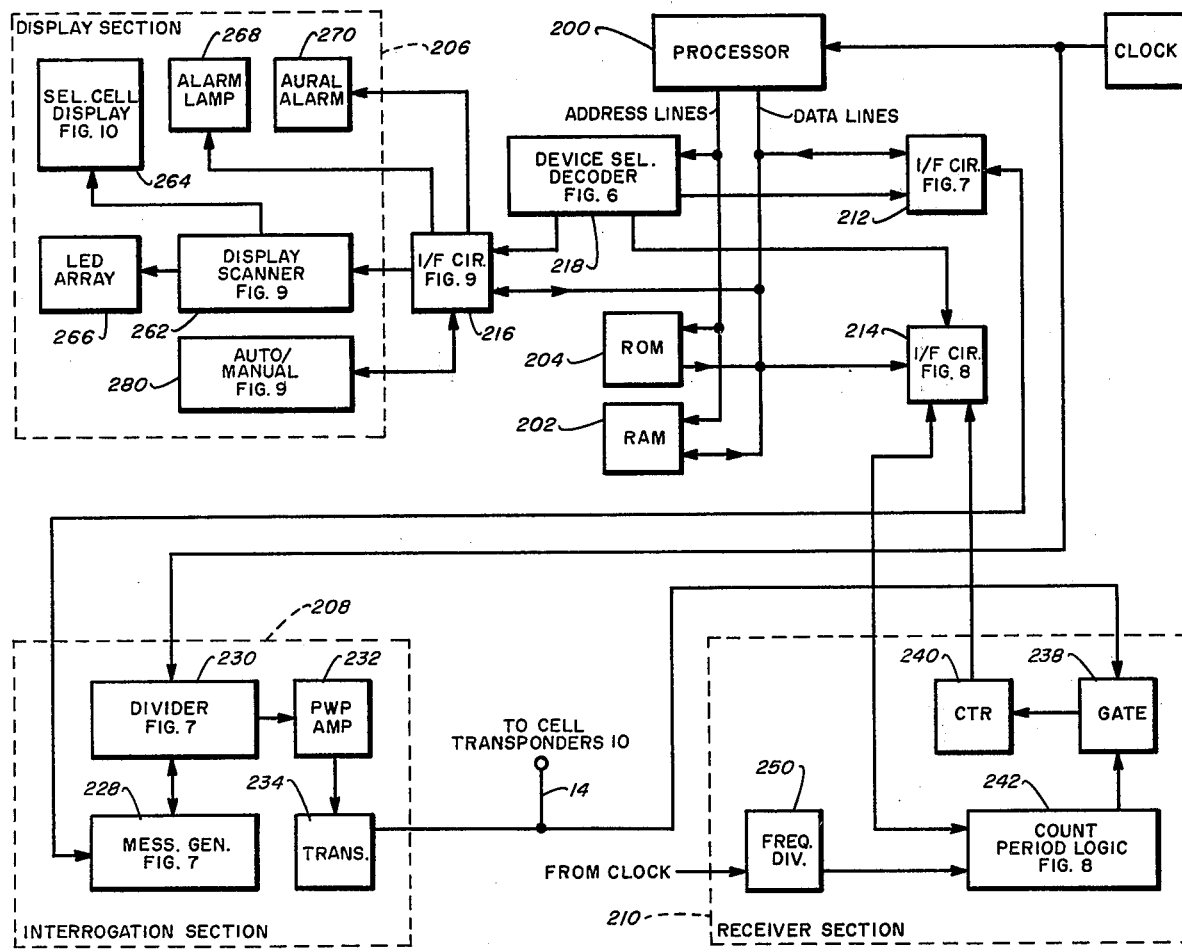

Referring now to the drawing, wherein like reference characters designate like or corresponding parts throughout the several views and, more particularly to FIGS. 1 and 2 which together illustrate a preferred embodiment of the battery monitoring system of the present invention in block diagram form, the battery monitoring system includes a plurality of cell transponders 10 shown in FIG. 1 and a scanner/display 12 shown in FIG. 2. Since each transponder 10 is identical to the others, only one transponder is illustrated in order to simplify the drawing. The display/scanner 12 is located at a monitoring station and a transponder 10 is located at each battery cell which is to be monitored. Preferably the transponder may be configured to reside in a housing which is adapted to screw into the cell in place of the normal cell cap. All transponders are coupled together and to the scanner/display 12 by a twisted pair of conductors represented by line 14 (common bus) capable of transmitting signals in the frequency range of 10 KHz–120 KHz.

Figure 4:
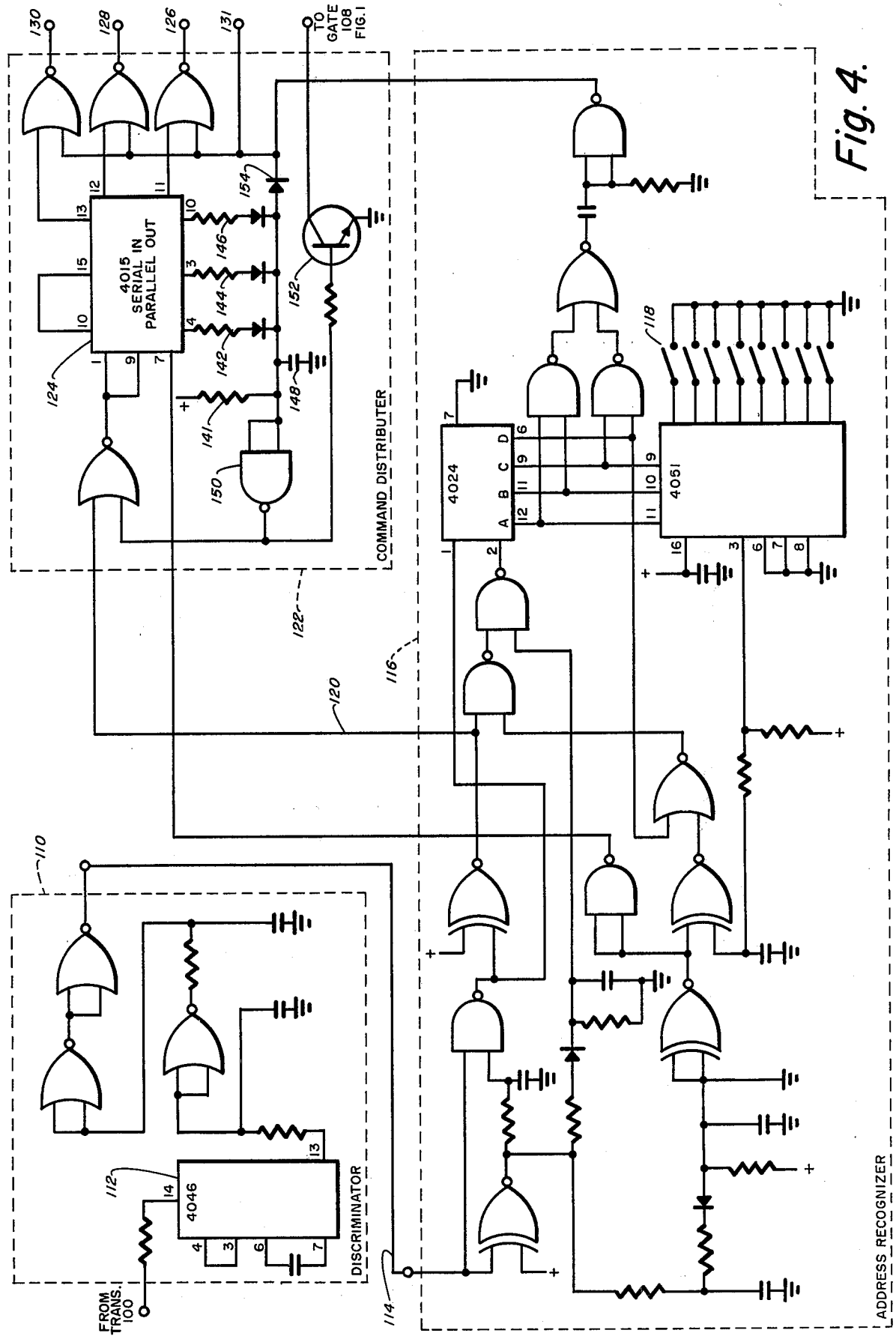
FIGS. 4 and 5 are electrical schematic drawings of portions of the transponder unit, and in particular.
Figure 5:
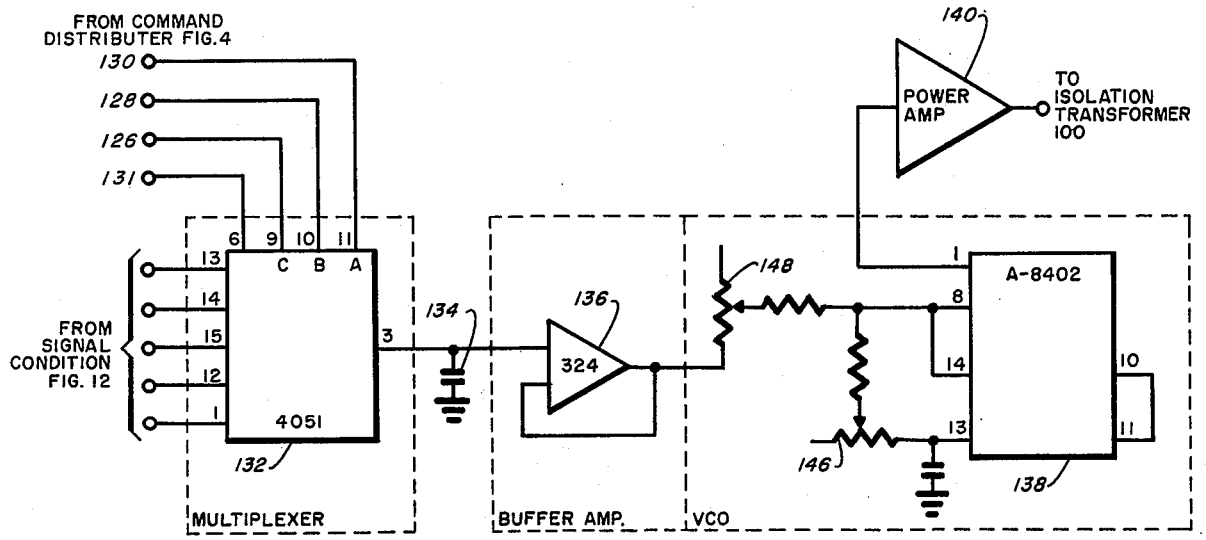

Considering first the transponder 10 and referring to FIG. 1 and also to FIGS. 4 and 5 which illustrate the blocks of FIG. 1 in greater detail and utilize reference numerals of 100 or greater, the twisted pair of conductors 14 from the scanner/display 12 is applied to an isolation transformer 100. Since the cells of the battery are connected in series in a submarine, each cell of the battery is at a different potential and, since each of the transponders 10 has its logical ground at the negative potential of the cell that it serves, the isolation transformer 100 is necessary to prevent the transponders from shorting out the battery. To minimize the amount of wiring since the battery cells may be located at various places around the submarine and many cells (100 to 200) are involved, the common bus 14 is used to transmit interrogation commands and power to the transponders 10 from the scanner/display 12 and also carries the reply signal which is sent back from the transponder to the scanner/display. The interrogating signal is transmitted at a high level (30 Vrms) and serves as the power source for all of the cell transponders.

To provide regulated and unregulated power for the transponder, the secondary of the isolation transformer is applied to power supplies 102 and 104, respectively, which each includes full-wave rectifiers (not shown) coupled to storage capacitors (not shown). The output of power supply 102 is applied to regulator 106 to provide logic power to the transponder circuitry. A regulated supply is required because the number of transponders and the length of common bus 14 to each transponder varies. The regulated power is always applied to the circuitry which receives interrogation commands from the scanner/display; however, the regulated power to the transponder reply circuitry is gated at 108 when the transponder interrogation logic recognizes that this particular transponder has been interrogated. The unregulated power from power supply 104 is utilized to amplify the transponder reply signal for transmission to the scanner/display 12.

Figure 3A:
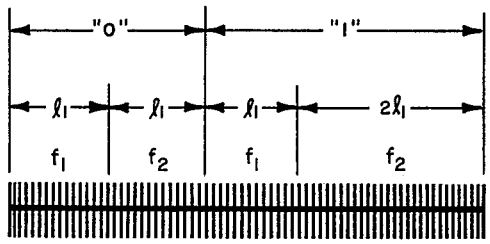
FIGS. 3a, 3b and 3c illustrate the interrogation commands of the present invention.
Figure 3B:
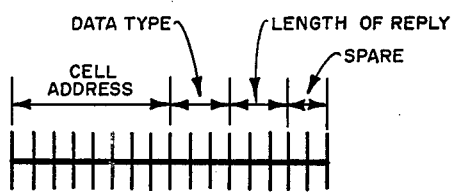

It is beneficial at this point in the description to describe the interrogation commands which are transmitted from the scanner/display to the transponders. Referring to FIG. 3a, the interrogation command consists of a tone burst in which a logical "0" is encoded as burst at a first frequency $f_1$ (for example, 60 KHz) of length $l_1$ followed by a burst of length $l_1$ at a second frequency $f_2$ (for example, 120 KHz). A logical "1" is encoded as a burst at the first frequency $f_1$ of length $l_1$ followed by a burst of length $2l_1$ at the second frequency $f_2$. FIG. 3b illustrates the data word in which bits 0–7 are the transponder address, bits 8–10 are the type of data requested, and bits 11–13 are the length of time for which the transponder 12 should send the data to the scanner/display 10. It should be noted at this point that the reply signal to the scanner/display is a tone burst in which the frequency represents the value of the data. The length of the reply is adjustable to allow this frequency to be determined with varying accuracy based on the particular type and accuracy of data required.

Figure 3C:
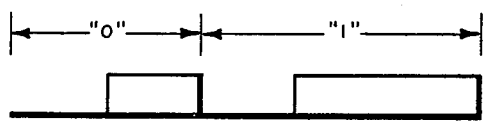

Referring again to FIG. 1, the output of the isolation transformer, which is a tone burst of logical "1's" and "0's" at frequency $f_1$ and $f_2$ as just described, is also applied to a discriminator 110 which is shown in more detail in FIG. 4. The discriminator 110 includes a 4046 integrated circuit 112 and three NOR circuits (unnumbered) which convert the tone burst input into a square wave output in which frequency $f_1$ (60 KHz) is converted to a low level and frequency $f_2$ (120 KHz) is converted to a high level as illustrated in FIG. 3c.

The output of the discriminator 110 is fed over line 114 to an address recognizer 116 which is also shown in detail in FIG. 4. The address recognizer 116 decodes the address command (bits 0–7) of the interrogation command, and if the command address corresponds to the setting of address selection switches 118, the data type command (bits 8–10) and the reply duration command (bits 11–13) (which are decoded in the address recognizer so that the high level signals of length $l_1$ and $l_2$ from the discriminator 110 are converted to a low level and a high level, respectively) are coupled over line 120 to a command distributor 122 as shown in FIG. 4. Bits 8–14 of the interrogation command are applied to a serial input/parallel output shift register 124 (integrated circuit type 4015) where bits 8–10 appear on the shift register terminals 11–13 and bits 11–13 appear on terminals 10, 3, and 4.

Considering first the selection of the data type, bits 8–10 are coupled via NOR gates (having outputs numbered 126, 128 and 130 in FIG. 4) to control inputs of an analog multiplexer 132 (integrated circuit type 4051) shown in FIG. 5. Analog multiplexer 132 is an 8-channel multiplexer having three binary control inputs (A, B and C) which select one of eight input channels to be turned on and connect that input channel to the multiplexer output. Analog data from the sensors is coupled to the input channels so that bits 8–10 select one of eight input signals for connection to the multiplexer output.

A sampling pulse is provided at an output 131 which is coupled to the inhibit input of the multiplexer 132 to gate the analog signals through the multiplexer for a brief period of time. The output of the multiplexer 132 (i.e., the analog signal from the selected sensor) is fed to a capacitor 134 which serves to hold the analog value which is then fed through a buffer amplifier 136 and applied to the input of a voltage-controlled oscillator (VCO) 138. The output of the VCO 138 (which is a signal having a frequency that is proportional to the analog data on the selected input to the multiplexer 132) is fed to a power amplifier 140 which amplifies the VCO output for transmission to the scanner/display 12 over common bus 14. The output of the power amplifier 140 is coupled to the secondary winding of the isolation transformer 100 and is thereby coupled to the common bus 14 through the primary winding of the transformer.

Bits 11–13 control the duration of the transponder reply in the following manner. Referring to the command distributor 122 of FIG. 4, the duration of the reply is controlled by the operation of resistors 141, 142, 144 and 146, capacitor 148, NAND gate 150, transistor 152, and diode 154. At the beginning of the reply period, capacitor 148 is discharged through diode 154 and transistor 152 is turned on. The capacitor 148 then charges with a slope determined by the data on terminals 4, 3 and 10 (i.e., bits 11–13) of the shift register and the values of resistors 141, 142, 144 and 146. The resistances of resistors 142, 144 and 146 are arranged in a binary sequence so that any of eight charging slopes are possible depending on the data on terminals 3, 4 and 10. When the voltage on the capacitor 148 rises past the threshold of gate 150, the gate cuts off and turns off the transistor 152. The collector of the transistor 152 is coupled to the gate 108 (FIG. 1) in the power supply circuitry to gate power to the reply circuitry (i.e., the circuitry shown in FIG. 5) for the period of time selected by data bits 11–13. The circuitry shown in FIG. 5 is therefore only operative during the period of time when transistor 152 is conducting.

The transponder 10 just described is capable of selecting one of eight analog input signals to the eight channel multiplexer 132 for application to the VCO 138. In the preferred embodiment, each analog input signal is a DC voltage which is proportional to a measured parameter of the cell. There are, of course, numerous techniques for sensing battery parameters (such as electrolyte level and temperature) and which may generate a voltage which is related to the parameter being measured. Typically, the outputs of these sensors, before being coupled to the multiplexer 132, would be passed through a signal conditioning amplifier which would normalize the signals so that their voltage range corresponds to the voltage range which produces the desired frequency range at the output of voltage-controlled oscillator 138.

Figure 12:
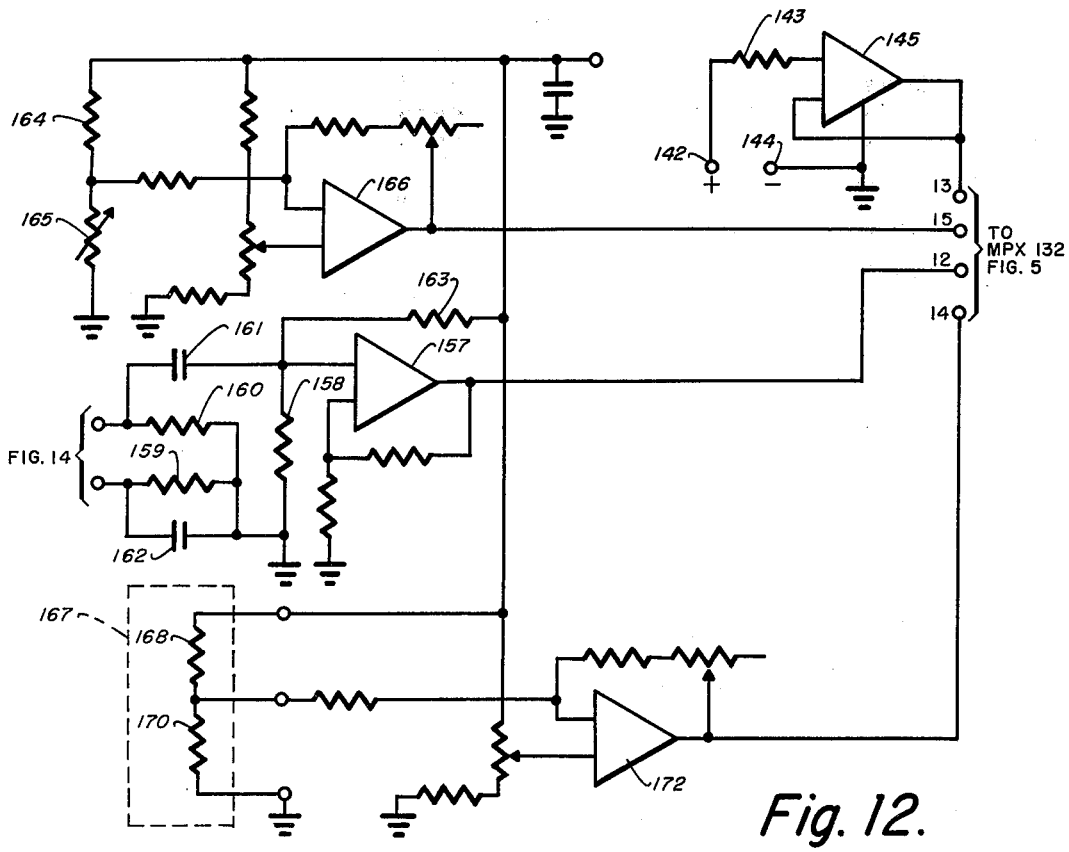
FIG. 12 is an electrical schematic diagram illustrating the sensors and signal conditioners of the present invention.

In the preferred embodiment, signals from five sensors are coupled to the multiplexer inputs. The sensors measure cell voltage, electrolyte level, electrolyte temperature, electrolyte circulation, and electrolyte specific gravity. These sensors, which are described briefly herein, are more fully described in copending patent applications, Ser. No. 66,755 filed on Aug. 15, 1979 by the present inventors. Considering first the measurement of cell voltage, (nominally 2 volts) and referring to FIG. 12, the positive terminal 142 of the cell is coupled through a protective 1 Kohm resistor 143 and a buffer amplifier 144 to one of the eight inputs of the multiplexer 132 (input 13 in FIG. 5). Note that the ground plane of each transponder is the negative terminal of the cell. When the cell voltage input is selected by the data type command from the scanner/display 12, the cell voltage is coupled to the VCO via amplifier 145 to control the frequency of the VCO output. Variable resistors 146 and 148 (see FIG. 5) are set to provide an output frequency which varies from 40 KHz to 120 KHz as the input of the VCO varies from 1 v to 3 v. It is noted that in the past, cell voltage has been monitored by connecting wires to the cell terminals and thence to the remote monitoring location. Leakage currents, voltage drops, and induced noise in the long cables carrying DC signals cause inaccuracies which are all avoided by converting the signal from a DC voltage to an AC frequency at the cell. Further, when DC cabling is used, the connection to the cell must be of low impedance to minimize errors from leakage currents and this creates hazards in the event of a short circuit. Typically, fuses have been employed at connection points to minimize this hazard; however, the present monitoring system avoids this problem entirely. Because leakage is no problem, the input impedance of the voltage-to-frequency converter can be made very high and the large series resistor 143 inserted at the cell terminal to limit the current in the event of a short circuit.

Figure 13:
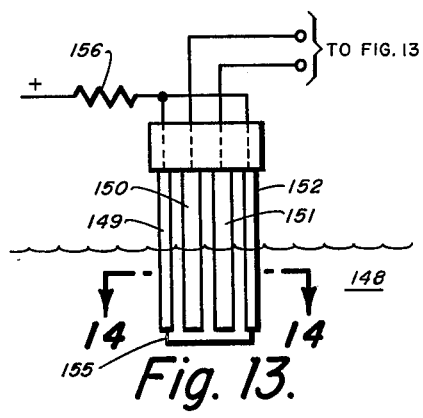
FIGS. 13 and 14 illustrate the sensor utilized to measure the electrolyte level and circulation in the preferred embodiment.
Figure 14:
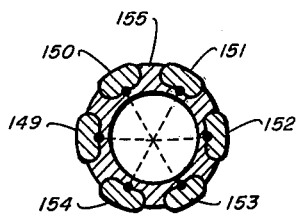

Considering now the measurement of electrolyte level, FIG. 13 shows a sensor 147 partially immersed in the electrolyte solution 148 of a wet cell battery. The sensor includes six elongated metal bars 149–154 partially embedded in a housing 155. Lead is preferred for use as metal bars 149–154 since it will not be consumed by the electrolyte as will many other metals. The housing 155 is made from an electrically insulating material such as polyethelene which does not chemically react with the electrolyte solution 148. The elongated bars 149–154 are disposed symmetrically about the circumference of the housing 155, as best shown in the cross-sectional view of FIG. 14, and are embedded therein so that a portion of the surface of each rod 149–154 is exposed to the ambient environment (i.e., either the electrolyte solution 148 or the atmosphere). The bars 149–154 are electrically coupled (by connections represented by dashed lines in FIG. 14) in pairs to form three electrodes. The bars disposed opposing each other (149 and 152, 150 and 153, and 151 and 154 forming a first, second and third electrode, respectively) are joined so that the fingers of the electrodes are interlaced. A polarizing current (from unregulated power supply 104) is applied via a current limiting resistor 156 to the first electrode formed by bars 149 and 152. The second electrode (bars 150 and 153) and the third electrode (bars 151 and 154) are coupled to the first and second input to a differential amplifier 157 via a DC blocking network including resistors 158, 159, and 160 and capacitors 161 and 162 (see FIG. 12). The gated transponder power (gated for the reply duration time) is coupled via resistor 163 and capacitor 161 to the second electrode. The output of the amplifier 157 is applied to the multiplexer 132 (FIG. 5) at terminal 12.

In operation, the electrolyte solution 148 provides a conduction path between the three electrodes. Since the three electrodes are otherwise electrically insulated from each other by the housing 155, the electrolyte solution 148 provides the only conduction path between the electrodes. Thus, the conductivity between electrodes depends on the presence of the electrolyte solution 148 and varies according to the level of the electrolyte solution. As the electrolyte level rises and falls, thereby increasing or decreasing the surface area of the electrodes in contact with the electrolyte 148, the conductivity between the electrodes increases or decreases accordingly. The second and third electrodes serve as sensing electrodes in determining the level of the electrolyte. The voltage pulse from the gated power supply is divided by the resistor 163 and the resistance between the second and third electrodes so that a pulse having an amplitude inversely proportional to the resistance between the electrodes is applied to the amplifier 157. This voltage is then normalized in amplifier 157 to provide an output which varies inversely according to the level of electrolyte and corresponds to the voltage range which produce the desired frequency range at the output of the voltagecontrolled oscillator 138.

Because the resistance between the sensor electrodes depends not only on the electrolyte level, but also on the surface chemistry of the electrodes, it is necessary to prevent the buildup of a contaminating layer (lead sulfate) on the two sensing electrodes. It is therefore preferable to sense the resistance with alternating current or with pulses having no direct current component since a direct current component would deposit a net charge on the battery cell comprising the sensing electrodes and cause a change in the surface composition. The polarizing current supplies a current to the first electrode to remove the contaminating layer which may otherwise accumulate on the two sensing electrodes due to the battery action.

The sensor for monitoring the circulation of the electrolyte is identical to the electrolyte level sensor just described and is not further discussed herein except as follows. The circulation is inferred by measuring the level of the electrolyte fountain at the air lift pump by inserting the sensor in the fountain so that the electrolyte in the fountain plays on the surface of the sensor. The resistance between the second and third electrodes will then indicate the height of the fountain from which the electrolyte circulation may be inferred.

The temperature is sensed in the preferred embodiment by applying the gated transponder power through a resistor 164 which is connected to one side of a thermister 165 which has its other side coupled to the transponder ground and is in thermal contact with the electrolyte. Resistor 164 and the thermister 165 form a voltage divider. Although the resistance of thermister 165 is nonlinear with temperature, the value of resistor 164 may be chosen so that the resistance at midpoint between the two varies nearly linearly with temperature. This voltage is applied to an amplifier 166 where the zero displacement and the gain are adjusted to normalize the signal for input to the multiplexer 132 on terminal 15.

The specific gravity of the electrolyte can be inferred from the index of refraction of the electrolyte. In the preferred embodiment the index of refraction is measured by a commercial refractometer 167, Model 68NA of Aracon Corp. of Burlington, Mass. As the refractive index of the electrolyte varies, the voltage at the junction of photoresistors 168 and 170 of the refractometer changes. This voltage which is related to the index of refraction is normalized in amplifier 172 and coupled to multiplexer 132 on terminal 14.

Figure 6:
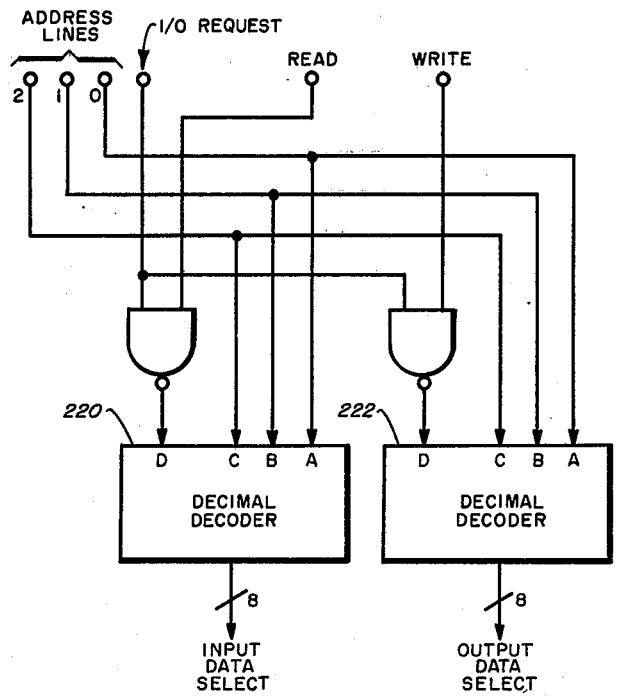
FIGS. 6–11 are electrical schematic drawings of portions of the scanner/display unit, and in particular.

Considering now the scanner/display 12, and referring to FIG. 2 which is a block diagram of the scanner/display and to FIGS. 6-11 which show some of the blocks of FIG. 2 in schematic form and expanded in detail and in which reference numerals of 200 or greater are used to identify the elements, the scanner/display includes a microprocessor (processor) 200 having a random access memory (RAM) 202 (of 2K bytes), and a programmable read only memory (PROM) 204 (of 4K bytes). The microprocessor used in the embodiment described herein is a Zilog Z-80 microprocessor manufactured by Prolog Corporation which has eight bidirectional data lines and sixteen address lines. The bidirectional data lines of the processor 200 are coupled to a display section 206, an interrogation section 208, and a receiver section 210 via a series of interface circuits 212, 214 and 216. The interface circuits and a device select decoder 218 together function as ports through which the processor 200 communicates with the various sections of the scanner/display. The interface circuits also serve to convert the processor output signals on the bidirectional data lines to signals having the proper characteristics for use by the various sections of the scanner/display and to convert the signals from these sections to the proper form for input to the processor on the data lines. In the device select decoder 218, as shown in FIG. 6, address lines 2, 1 and 0, the input/output request signal, and a read signal or a write signal (all from the processor 200) are applied to a pair of decimal decoders 220 and 222 to produce one of eight input data select (IDS) signals or one of eight output data select (ODS) signals. The input data select and the output data select signals are coupled to the appropriate interface circuit, as listed in Table I below, where they enable the selected interface circuit so that the information on the data lines is coupled to or from the appropriate section of the scanner/display.

Each data line is amplified in a buffer amplifier (not shown in the drawing) before being applied to the interface units. The signals flowing on the data lines from the interface circuit to the processor 200 are also passed through buffer amplifiers (not shown) which are enabled by the combination of the "M1" cycle signal, the input/output request signal and the read signal from the processor 200. This arrangement decouples the input data from the bidirectional data lines except when the buffer amplifiers are enabled as the processor 200 interrogates the various input ports.

TABLE I

| Address Bit | | | | | Interface | Element |
|---|---|---|---|---|---|---|
| 2 | 1 | 0 | Read | Write | Circuit | Signal |
| 0 | 0 | 0 | 0 | 1 | 216 | Latch 256 |
| 0 | 0 | 1 | 0 | 1 | 216 | Latch 258 |
| 0 | 1 | 0 | 0 | 1 | 216 | Latch 260 |
| 0 | 1 | 1 | 0 | 1 | 212 | Latch 224 |
| 1 | 0 | 0 | 0 | 1 | 212, 214 | Latch 226, 244 |
| 1 | 0 | 1 | 0 | 1 | | External Terminal |
| 1 | 1 | 0 | 0 | 1 | Logic 242 | Flip Flop 246 (R) |
| 1 | 1 | 1 | 0 | 1 | Logic 242 | Flip Flop 246 (S) |
| 0 | 0 | 0 | 1 | 0 | 216, 212 | Latches 236 |
| 0 | 0 | 1 | 1 | 0 | | External Terminal |
| 0 | 1 | 0 | 1 | 0 | 214 | Amp's 254 |
| 0 | 1 | 1 | 1 | 0 | 214 | Amp's 255 |
| 1 | 0 | 0 | 1 | 0 | 216 | Flip Flop 288 (CLR) |
| 1 | 0 | 1 | 1 | 0 | 216 | Flip Flop 282 (CLR) |
| 1 | 1 | 0 | 1 | 0 | 216 | Flip Flop 284 (CLR) |
| 1 | 1 | 1 | 1 | 0 | | Unused |

Figure 7:
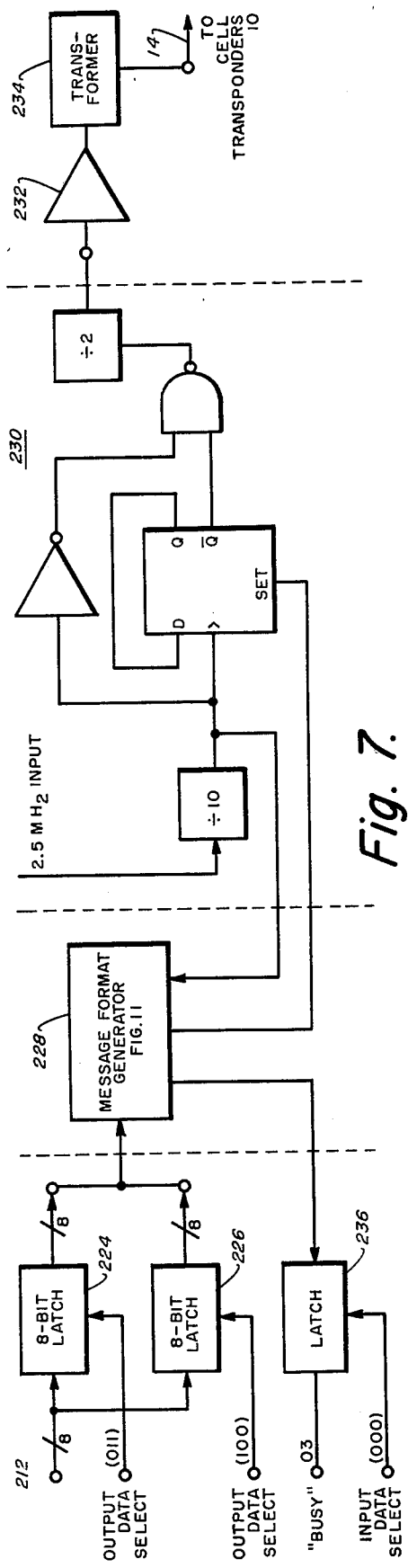
Figure 11:
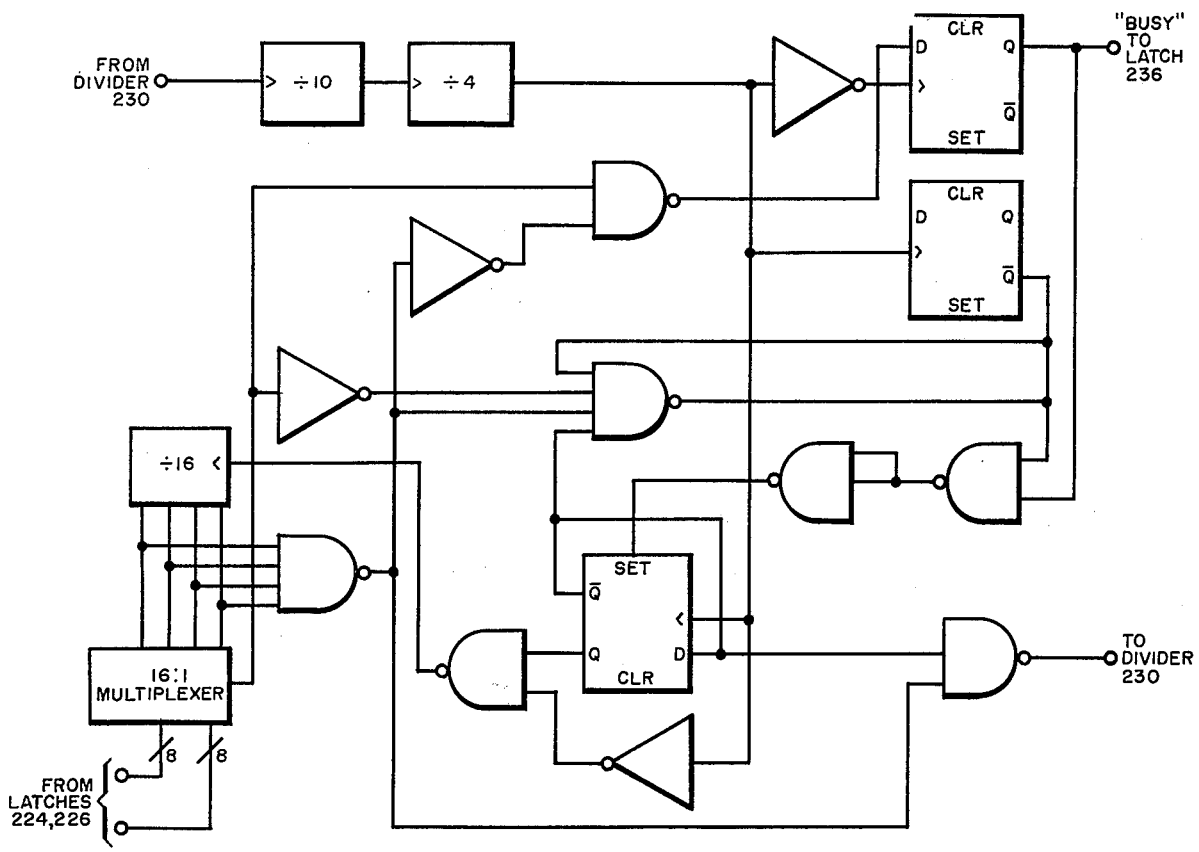

Considering now the interrogation section 208 and the interface circuits 212 associated therewith and referring to FIGS. 2, 7 and 11, in order to send an interrogation command, the processor 200 enables the appropriate address lines, the write signal, and the I/O request (as shown in Table I) to the device select decoder 218 which enables the appropriate output data select signals. The output data select signals (ODS 011 and 100, i.e., addresses 011 and 100) are coupled to the interface circuit 212 (FIG. 7) where they enable two 8-bit latches (224 and 226) for receipt of the command on the data lines. The latched outputs (16-bit command) are coupled to a message format generator 228 which is illustrated in detail in FIG. 11 and which generates a command word of the type illustrated in FIG. 3c. The command word is fed into a programmable divider 230 which converts the command word to a series of tone bursts at frequency $f_1$ and frequency $f_2$ of the type illustrated in FIG. 3a. The command word (tone bursts) is amplified in power amplifier 232 and applied to the primary winding of an output transformer 234. The secondary of the transformer 224 is coupled to the common bus 14 so that the interrogation command is coupled to the transponders 10. When an interrogation command is being sent, the message format generator 228 activates a latch 236 in interface circuit 212 which places an "interrogator busy" signal on a processor data line 03 for use when the processor 200 interrogates the interrogation section 208 via the device select decoder 218.

Figure 8:
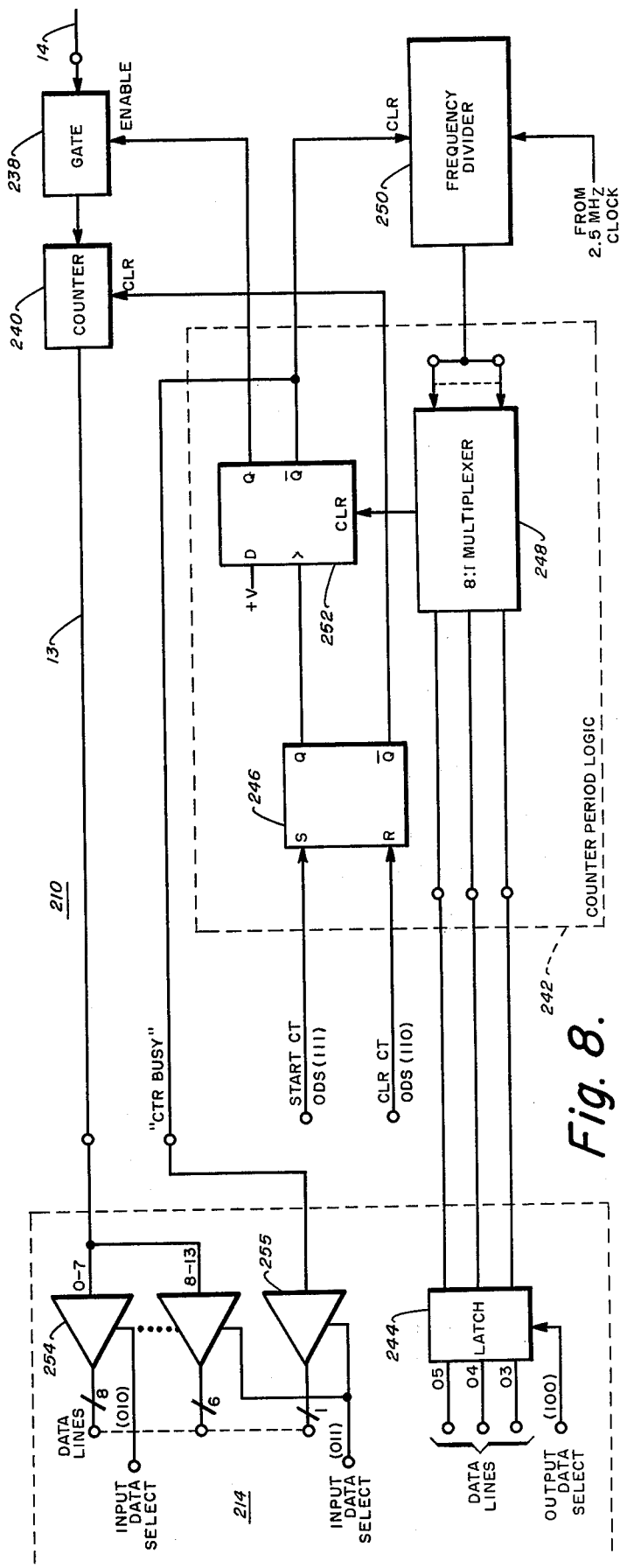

Referring now to FIG. 2 and to FIG. 8 which is a detailed drawing of the receiver section, the receiver section 210 is coupled to the output of the voltage controlled oscillator 138 (of the cell transponder 10) via the common bus 14. Because the information (sensor data) is contained in the frequency of the signal from the transponder 10, the receiver section 210 contains circuitry to determine the frequency. The signal on bus 14 is fed through a gate 238 to a counter 240. The gate 238 is enabled by a signal from a count period logic circuit 242 in response to commands from the processor 200. The processor sends an output data select signal (ODS 100) and three data bits to a latch 244, a start count signal (ODS 111) to the R terminal of an R-S flip flop 246, and a clear counter signal (ODS 110) to the S-terminal of flip flop 246 (as noted in Table I). The outputs of the latch 244 are coupled to a multiplexer 248 to select one of eight inputs from a frequency divider 250 to set the counting duration. Frequency divider 250 repetitively divides a 2.5 MHz clock input to provide eight outputs which range from 2.4 Hz to 312.5 Hz in powers of 2. The output of the multiplexer 248 is coupled to the clear input of a flip flop 252. Flip flop 252 has its clock input coupled to the Q output of R-S flip flop 246, its Q output coupled to the enable terminal of gate 238 and its $\bar{Q}$ output coupled to clear the frequency divider 250 and to a buffer amplifier 255 to provide a "counter busy" signal.

In operation, the start count command causes the Q output of flip flop 252 to enable gate 238. The gate remains enabled until a pulse from multiplexer 248 clears flip flop 252 and thereby disables the gate 238 which removes the input from the counter 240. The count in counter 240 is applied to a series of buffer amplifiers 254 may be enabled by the appropriate input data select signal (Table I) from the processor to allow the processor to read the count. Since the processor previously set the count period, the frequency of the signal from the transponder may be determined from the count and the count duration.

Figure 9:
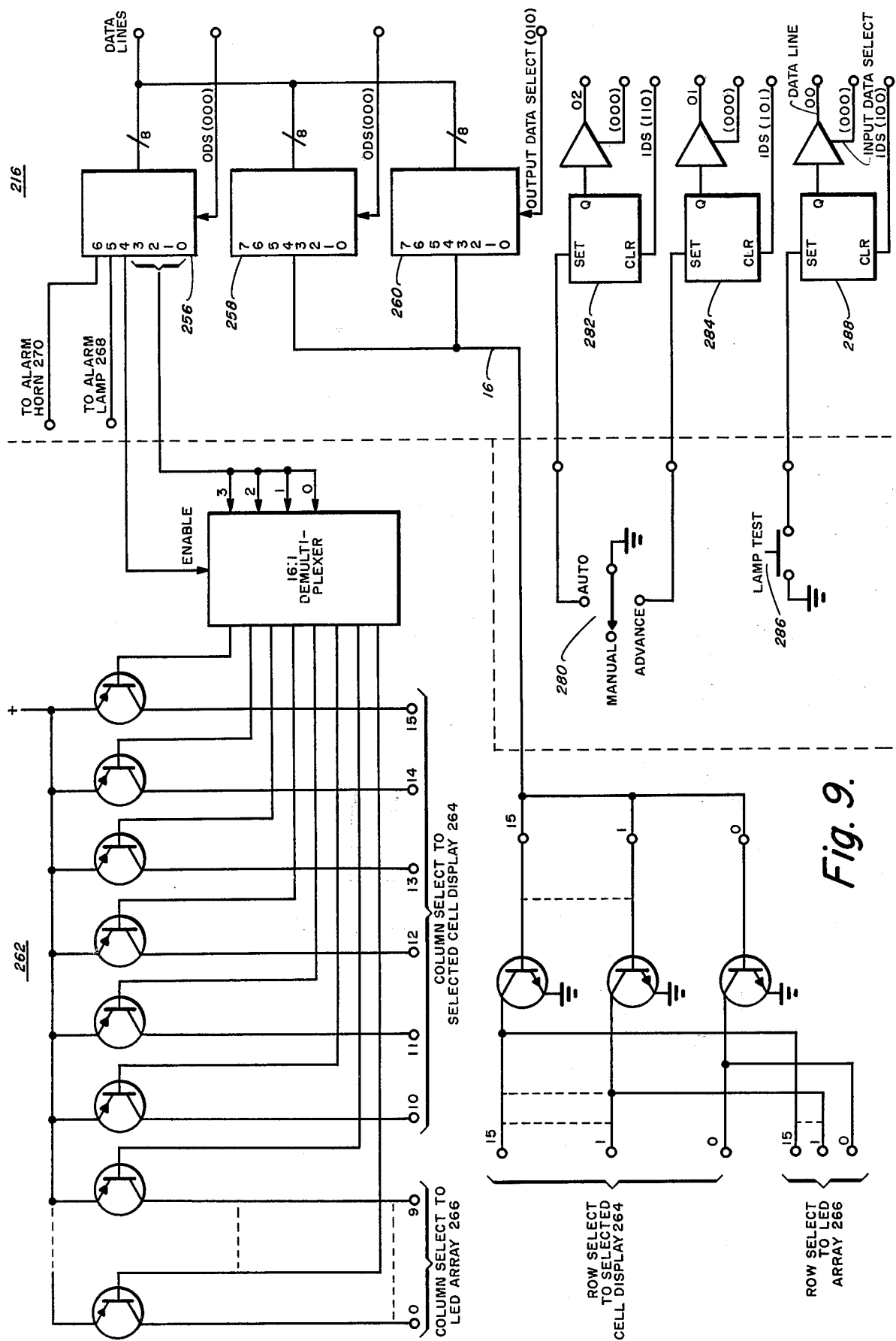
Figure 10:
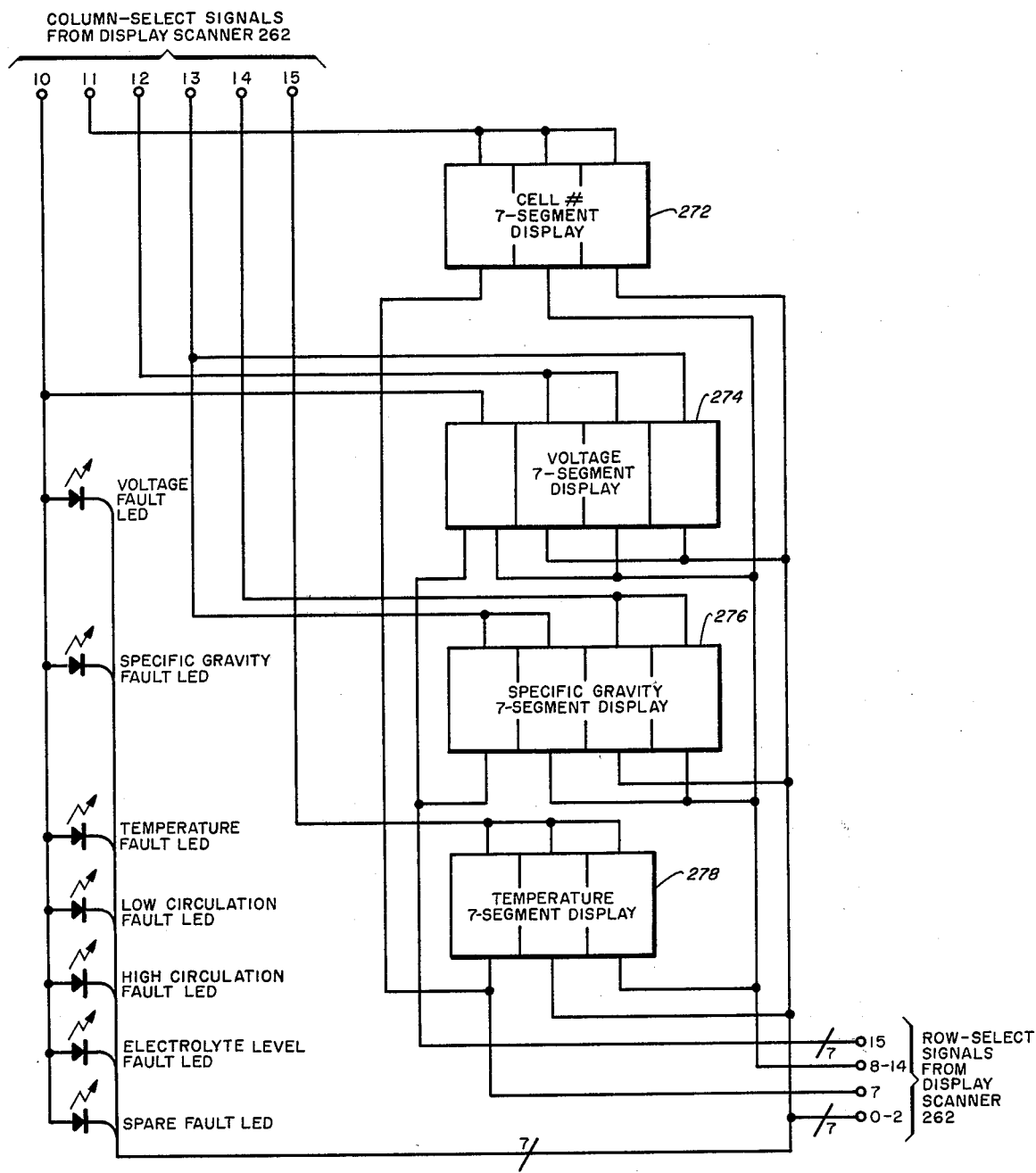

Considering now the display section 206, and referring to FIG. 2 and to FIGS. 9 and 10, the display section provides a visual indication of the various battery parameters which are monitored by the system and a visual and an aural alert which may be activated by the processor 200 when the monitored parameters do not meet preestablished criteria. As shown in FIG. 9, the bidirectional data lines of the processor 200 are coupled to three 8-bit latches 256, 258 and 260 which are enabled by an output data select signal (see Table I). The outputs of the latches are coupled to a display scanner 262 which distributes the signal to a selected cell display 264, a battery display LED array 266, an alarm lamp 268, and an alarm horn 270.

The selected cell display 264 shown in FIG. 10, includes four 7-segment digital displays which are under control of processor 200 display cell number (digital display 272), cell voltage (digital display 274), electrolyte specific gravity (digital display 276) and electrolyte temperature (digital display 278), and light emitting diode (LED) fault indicators for displaying cell voltage, electrolyte specific gravity, electrolyte temperature, electrolyte level, and electrolyte circulation (high and low).

The battery display LED array 266 is a 10×13 matrix of LED's in which each LED may represent a battery cell. Each LED is activated by the processor when the processor determines that a parameter of the cell represented by the LED is out of specification. The scanner/display 12 also includes an auto/manual/advance switch 280 which is coupled to the set inputs of a pair of flip flops 282 and 284 (included in interface circuit 216 and shown in FIG. 9). A lamp test pushbutton 286 is coupled to a third flip flop 288. The Q outputs of the flip flops are gated to the bidirectional data lines of the processor when an input data select signal (IDS 000) is fed from the processor via the device select decoder 218.

The processor program is contained in the programmable read only memory (PROM) 204. PROM 204 (type 2708) has three sections with each section capable of storing 8192 bits (1024 8-bits bytes). The contents of the PROM's in the preferred embodiment are given below in hexidecimal notation. A simplified flow diagram illustrating the operation of the processor program follows the PROM contents.

PROM 0, MONITOR

Navy Case 61,536 dm0s200

```
0000:  C3 A0 14 00    00 00 00 00    F5 F5 3E 80    18 3C 00 00
0010:  C3 00 14 DB    00 E6 40 C8    DB 01 C9 00    00 00 00 00
0020:  E1 23 23 E5    2B 2B E9 CD    13 00 28 FB    E6 7F C9 00
0030:  C3 45 00 F5    18 05 00 00    C3 45 00 DB    00 E6 80 28
0040:  FA F1 D3 05    C9 E3 2B E3    F5 97 C5 47    D5 E5 21 E9
```

```
0050:  27 00 00 00    00 00 00 00    78 EB 21 09    00 39 01 0A
0060:  00 ED B8 13    EB F9 EB 01    0B 00 09 E5    DD E5 FD E5
0070:  EB 09 4D 2B    E5 DD E1 FE    01 38 07 71    23 36 00 00
0080:  00 00 ED 57    67 2E 00 E2    8B 00 2C E5    08 F5 08 D9
0090:  C5 D5 E5 D9    21 F0 03 D4    0F 02 01 86    50 DC 23 03
00A0:  DD E5 E1 6E    7E FE 0B 20    0A 34 2B 56    2B 5E 2B ED
00B0:  A8 18 F1 7D    2B 77 11 E6    FF 19 F9 CD    4D 01 11 BE
00C0:  00 D5 21 AE    03 CD 0F 02    CD DD 01 C8    D6 44 38 15
00D0:  FE 14 30 11    5F 16 00 4A    EB 29 19 5E    23 56 EB CD
00E0:  DD 01 FE 4D    E9 3E 3F CD    12 01 18 B4    CD A5 01 78
00F0:  B2 E6 03 B1    B3 20 EE E5    21 40 01 E3    CD 1A 02 E3
0100:  2B 7C B5 20    F6 E1 18 61    CD EC 01 2B    CD EC 01 2B
0110:  3E 20 C3 23    01 FE 1B 28    D1 FE 7D 28    CD CD 13 00
0120:  20 F1 F1 E5    F5 E6 7F CD    33 00 21 AB    03 FE 0D CC
0130:  0F 02 FE 3C    20 0B F1 3E    0D F5 D5 C5    CD C2 00 C1
0140:  D1 F1 E1 C9    CD 27 00 CD    12 01 00 00    C9 3E 0D 18
0150:  C1 97 CD 8B    01 CD DE 01    20 9B EB C9    CD 4D 01 CD
0160:  F2 01 3E 3A    18 AC DC A5    01 1A ED A1    2B C4 F2 01
0170:  C4 E9 01 EB    C4 E9 01 C4    EF 01 C4 4D    01 EB 23 13
0180:  E0 18 E6 CD    A5 01 CD 1A    02 18 DE CD    AE 01 EB CD
0190:  DE 01 FE 53    20 05 CD AD    01 18 07 CD    AE 01 B7 ED
01A0:  52 23 44 4D    C9 CD 8B 01    CD AE 01 18    A8 97 C5 21
01B0:  00 00 CD DE    01 CD C6 01    DA E5 00 CD    44 01 CD C6
01C0:  01 78 30 F7    C1 C9 47 D6    30 D8 C6 E9    D8 D6 FA 30
01D0:  03 C6 07 D8    C6 0A 29 29    29 29 B5 6F    C9 97 B7 CC
01E0:  44 01 FE 20    28 F9 FE 0D    C9 CD 10 01    7E 18 08 CD
01F0:  10 01 7C CD    F7 01 7D CD    FB 01 1F 1F    1F 1F 1F F5
;

0200:  E6 0F FE 0A    38 02 C6 07    C6 30 CD 12    01 F1 C9 F5
0210:  7E 23 CD 12    01 17 30 F8    F1 C9 E5 D5    C5 ED B0 C1
0220:  D1 E1 C9 01    00 06 CD DE    01 28 3A FE    5C 20 0D 4F
0230:  21 30 00 36    C3 21 45 00    22 31 00 97    CD AE 01 CB
0240:  71 EB DD E5    E1 28 18 05    CA E5 00 6E    23 EB ED A0
0250:  2B 36 F7 EB    73 23 72 23    36 0B DD 75    00 18 C7 2B
0260:  72 2B 73 18    C1 E1 E1 D1    C1 F1 D9 08    F1 ED 47 F3
0270:  30 01 FB FD    E1 DD E1 D1    21 0A 00 45    39 EB 1B 2B
0280:  1A 77 BE 20    03 10 F7 F9    E1 D1 C1 F1    C9 01 80 41
0290:  20 3F CD 51    01 16 10 CD    5C 01 CD E9    01 ED A1 E2
02A0:  4D 01 15 28    F0 7A E6 03    CC 10 01 CC    10 01 18 EA
02B0:  20 16 97 47    CD A8 01 EB    CC 5C 01 CC    10 01 CD 32
02C0:  03 C8 23 3E    07 A5 18 F0    47 CD 44 01    FE 27 20 02
02D0:  0C 97 CD 55    01 78 D6 41    DA E5 00 FE    19 D2 E5 00
02E0:  5F 16 00 21    D7 03 19 7E    B7 28 33 1E    00 CB 41 28
02F0:  06 CB 76 28    29 1E 10 E6    1F 83 5F C5    78 CD 12 01
0300:  FE 48 3E 4C    CC 12 01 EE    71 CB 41 28    02 3E 27 CD
0310:  12 01 46 DD    E5 E1 ED 52    CD 32 03 78    C1 C8 04 07
0320:  30 B3 07 CD    4D 01 38 05    06 41 0C 18    A8 CB 41 28
0330:  A4 C9 CD EC    01 CB 68 28    04 2B CD EC    01 79 07 38
0340:  0A 3E 2E CD    12 01 CD 44    01 FE 2F DC    12 01 38 0C
0350:  EB CD AE 01    EB 73 CB 68    28 02 23 72    FE 0D C4 10
0360:  01 C9 00 00    00 00 00 00    00 00 00 CD    A8 01 7B CD
0370:  F7 01 CD 10    01 4B ED 78    CD F7 01 CD    4D 01 C9 CD
0380:  AE 01 E5 CD    51 01 03 D1    CD 4D 01 7B    ED B1 E0 2B
0390:  CD F2 01 23    CD 10 01 7B    CD F7 01 CD    4D 01 18 EB
03A0:  CD AE 01 EB    CD A8 01 4B    ED 69 C9 0A    00 80 BB 8D
03B0:  02 E5 00 7F    03 23 02 E5    00 6B 03 E5    00 E5 00 E5
03C0:  00 83 01 E5    00 A0 03 EC    00 E5 00 E5    00 B0 02 E5
03D0:  00 E5 00 66    01 E5 00 43    45 46 47 48    44 00 E9 11
03E0:  00 00 00 00    12 00 21 00    00 2B 00 00    00 00 2D AF
03F0:  0D 0D 37 30    32 2D 30 30    20 4D 4F 4E    20 30 2E B1
;
```

PROM 1, UTILITIES

Navy Case 61,536 dm800s200

```
0800: 06 FF 21 A9   24 6E CB 25   26 22 CB 77   7E 4F 20 0E
0810: E6 E0 28 1C   79 D6 20 77   CB 7F 28 14   18 10 E6 E0
0820: FE E0 28 0A   79 C6 20 77   CB 7F 20 02   06 00 18 78
0830: 25 25 C3 40   08 00 00 00   00 00 00 00   00 00 00 00
0840: 3A A8 24 E6   07 20 31 56   23 5E E5 62   6B CB 3A CB
0850: 1B 19 DB 02   5F DB 03 CB   23 17 CB 23   17 57 19 CB
0860: 3C CB 1D EB   E1 73 2B 72   3A 08 25 BA   30 08 3A 09
0870: 25 BA 38 02   06 00 18 30   24 3D 20 2E   56 23 5E E5
0880: 62 6B CB 3A   CB 1B 19 DB   02 5F DB 03   CB 23 17 CB
0890: 23 17 CB 23   17 57 19 CB   3C CB 1D EB   E1 73 2B 72
08A0: 3A 0A 25 BA   30 02 06 00   18 39 24 3D   20 37 4E 23
08B0: 5E E5 79 E6   1F 57 79 E6   E0 4F 62 6B   19 19 DB 02
08C0: 5F DB 03 CB   23 17 CB 23   17 57 19 54   CB 3C CB 1D
08D0: CB 3C CB 1D   7C B1 5D E1   73 2B 77 3A   0B 25 BA 38
08E0: 02 06 00 18   34 24 3D 20   32 5E 16 00   E5 62 6B 19
08F0: 19 DB 03 E6   3F 57 DB 02   CB 3A 1F CB   3A 1F 5F 19
0900: CB 3C CB 1D   CB 3C CB 1D   5D E1 73 3A   0C 25 BB 30
0910: 08 3A 0D 25   BB 38 02 06   00 18 2B 23   5E 16 00 E5
0920: 62 6B 19 19   DB 03 E6 3F   57 DB 02 CB   3A 1F CB 3A
0930: 1F 5F 19 CB   3C CB 1D CB   3C CB 1D 5D   E1 73 3A 0E
0940: 25 BB 30 02   06 00 CD 66   25 C3 73 25   00 00 00 00
0950: 97 57 3A AA   24 4F E6 0F   CB 27 5F 21   80 24 19 79
0960: E6 F0 FE 70   38 03 23 D6   70 4F 56 A7   28 06 CB 0A
0970: D6 10 18 F8   80 28 1D CB   42 C0 42 EB   21 B6 24 00
0980: 00 CB FE EB   3A A9 24 32   C3 24 3A AA   24 32 C4 24
0990: 50 14 18 04   CB 42 C8 15   79 A7 28 06   CB 02 D6 10
09A0: 18 F8 72 C9   00 00 00 00   00 00 00 00   00 00 00 00
09B0: 79 32 BA 24   0E 00 CB 20   68 26 20 3A   08 25 56 BA
09C0: 38 04 CB C1   18 08 3A 09   25 BA 30 02   CB C1 C5 23
09D0: 5E 2B 24 E5   21 27 25 7E   23 46 23 4E   E7 18 58 EB
08E0: 21 BB 24 72   23 73 E1 56   23 5E 3A 0A   25 BA 38 04
09F0: C1 CB C9 C5   2B 24 E5 21   2A 25 7E 23   46 23 4E E7
;
``` dma00s200

Navy Case 61,536

```
0A00: 18 35 EB 21   BD 24 72 23   73 E1 7E 23   5E 2B 24 CB
0A10: 23 17 30 04   C1 CB F1 C5   CB 23 17 E6   7F 00 57 3A
0A20: 0B 25 BA 30   04 C1 CB D1   C5 E5 21 2D   25 7E 23 46
0A30: 23 4E E7 18   02 18 17 C5   26 00 6C 06   08 17 30 01
0A40: 19 CB 3A CB   1B 10 F6 C1   09 3E 80 84   67 C9 EB 21
0A50: BF 24 73 E1   5E 23 56 21   0C 25 7E BB   C1 38 02 CB
0A60: E1 23 7E BB   30 02 CB D9   23 7E BA 18   02 CB E9 79
0A70: 48 CB 39 06   00 21 A5 24   CB 46 EB 21   00 24 09 28
0A80: 0D BE C8 77   EB CB D6 21   B6 24 CB C6   18 09 4F 7E
0A90: 2F B1 2F 28   01 71 79 32   C0 24 21 A7   24 CB FE 00
0AA0: 11 BB 24 E7   18 08 11 BD   24 E7 18 02   18 45 EB 56
0AB0: 23 5E CB 3A   CB 1B CB 3A   CB 1B 2B 97   EB 01 E8 03
0AC0: 3C ED 42 30   FB 3D A7 ED   4A 07 07 07   07 F5 97 01
0AD0: 64 00 3C ED   42 30 FB 3D   A7 ED 4A 47   F1 B0 EB 77
0AE0: 23 7B 06 0A   14 90 30 FC   15 80 47 7A   07 07 07 07
0AF0: B0 77 C9 C3   70 25 00 00   00 00 00 00   00 00 00 00
0B00: FB 21 A7 24   CB 7E 20 0B   21 94 24 97   06 0C 77 23
0B10: 10 FC C9 21   E7 24 3A BA   24 47 E6 0F   16 0B C6 F0
0B20: 5F 1A 77 78   E6 F0 1F 1F   1F 1F FE 0A   0E 00 38 04
0B30: D6 0A 0E 80   2B C6 F0 5F   1A B1 77 2B   2B 3A C0 24
0B40: CB 77 28 10   36 40 23 97   77 21 E8 24   06 08 77 23
0B50: 10 FC 18 7B   77 21 EA 24   3A BC 24 47   E6 0F C6 F0
0B60: 5F 1A 77 78   E6 F0 1F 1F   1F 1F 2B C6   F0 5F 1A 77
```

```
0B70: 3A BB 24 47    E6 0F 2B C6    F0 5F 1A 77    78 E6 F0 2B
0B80: 2B 2B 1F 1F    1F 1F C6 F0    5F 1A F6 80    77 3A BE 24
0B90: 47 E6 0F 23    23 23 23 23    23 23 23 C6    F0 5F 1A 77
0BA0: 78 E6 F0 2B    1F 1F 1F 1F    C6 F0 5F 1A    77 3A BD 24
0BB0: 2B C6 F0 5F    1A F6 80 77    97 47 4F 3A    BF 24 FE 64
0BC0: 38 04 0E 80    D6 64 FE 0A    38 07 04 D6    0A 18 F7 18
0BD0: 11 23 23 23    23 C6 F0 5F    1A 77 2B 78    C6 F0 5F 1A
0BE0: B1 77 01 0C    00 11 94 24    21 E4 24 F3    ED B0 FB C9
0BF0: 3F 06 5B 4F    66 6D 7C 07    7F 67 00 00    00 00 00 00
;
```

PROM 3, DATA STORE AND DISPLAY

Navy Case 61,536 dm1400s200

```
1400: D5 E5 F5 DB    00 CB 47 DB    04 21 A0 24    7E 28 13 E6
1410: 1E 0F F6 40    2F D3 00 2F    3C 07 77 97    D3 01 D3 02
1420: 18 24 E6 1E    5F 54 23 3E    FF D3 01 D3    02 7E E6 60
1430: 07 B3 0F 2F    D3 00 EB CB    FD 7E 2F D3    01 23 7E 2F
1440: D3 02 23 EB    2B 73 F1 E1    D1 FB C9 00    00 00 00 00
1450: DB 03 07 30    01 C9 21 B9    24 7E 3D 77    28 01 C9 21
1460: 80 24 16 00    0E 13 06 07    7E 0F 30 12    5F 7A 0F 0F
1470: 0F 0F D3 03    DB 00 CB 67    7B 28 03 3E    7F A3 14 10
1480: E8 0F 77 97    B1 20 01 C9    0D 23 CB 41    28 D8 3E F0
1490: A2 C6 10 57    18 D0 00 00    00 00 00 00    00 00 00 00
14A0: 01 A0 00 11    F0 24 21 D0    14 ED B0 21    00 20 70 54
14B0: 5D 13 01 EF    04 ED B0 21    00 22 36 E0    54 5D 13 01
14C0: FF 00 ED B0    3E 02 32 A7    24 C3 F0 24    00 00 00 00
14D0: DB 00 CB 6F    CA 30 25 3E    01 F5 F5 C3    4A 00 00 00
14E0: 18 18 18 20    20 20 20 28    28 33 15 14    01 FF 01 00
14F0: 00 00 00 00    00 00 00 00    40 00 50 FC    D4 09 F0 00
1500: 07 03 02 02    02 00 00 59    7F A0 1A 7D    00 04 00 C8
1510: 31 90 27 DB    00 F6 DC 3C    C2 40 25 DB    04 DB 05 F7
1520: FB CD 00 16    CD 60 16 CD    90 16 CD 50    14 CD 00 17
1530: C3 33 25 00    00 00 00 00    00 00 00 00    00 00 00 00
1540: C3 00 08 C3    40 08 CD 50    09 C3 70 15    C3 B0 09 00
1550: C3 00 0B C3    70 17 00 00    00 00 00 00    00 00 00 00
1560: 00 00 00 00    00 00 00 00    00 00 00 00    00 00 00 00
1570: 21 A6 24 7E    CB 47 28 2A    CB 4F C0 C6    02 77 21 C5
1580: 24 7E 3C FE    80 38 08 97    77 47 23 77    4F 18 53 77
1590: 47 23 7E 3C    4F E6 0F FE    0A 38 04 79    C6 06 4F 71
15A0: 18 40 CB 8F    77 2B 7E CB    47 20 11 CB    4F 28 3A 97
15B0: 00 77 21 B6    24 CB 86 21    C5 24 18 CB    CB 4F 20 11
15C0: CB CF 77 21    B6 24 CB 7E    CB BE 21 A7    24 CB BE 18
15D0: 14 CB 57 C0    21 B6 24 CB    7E C8 CB BE    21 C3 24 46
15E0: 23 4E C3 6C    25 C3 70 25    00 21 C5 24    46 23 4E 18
15F0: F1 00 00 00    00 00 00 00    00 00 00 00    00 00 00 00
;
``` dm1600s200

Navy Case 61,536

```
1600: DB 00 4F DB    05 DB 06 06    20 11 A2 24    CB 49 E7 18
1610: 32 11 A4 24    CB 51 E7 18    2A 21 C1 24    3A A3 24 A7
1620: 20 05 97 77    23 77 C9 7E    3C 77 FE BE    30 04 23 36
1630: 01 C9 FE FF    20 02 36 BF    CB 6E 23 28    03 CB C6 C9
1640: CB 86 C9 EB    7E 23 28 0A    B8 C8 3C B8    20 0B CB C6
1650: 18 07 B7 C8    3D 20 02 CB    86 2B 77 C9    00 00 00 00
1660: 3A C2 24 21    A6 24 A7 28    03 CB C6 C9    CB 86 C9 00
1670: 00 00 00 00    00 00 00 00    00 00 00 00    00 00 00 00
1680: 00 00 00 00    00 00 00 00    00 00 00 00    00 00 00 00
1690: 21 B6 24 CB    46 20 0A CB    8E 21 A1 24    CB EE CB B6
16A0: C9 CB 4E 20    0D CB CE 21    1B 25 11 AB    24 01 05 00
16B0: ED B0 11 A1    24 21 B7 24    7E 3D 77 20    14 3A 18 25
```

```
16C0: 21 AB 24 CB   06 CB 46 EB   20 04 CB EE   18 02 CB AE
16D0: EB 21 B8 24   7E 3D 77 C0   3A 1A 25 77   21 AF 24 CB
16E0: 26 2B CB 16   2B CB 16 2B   CB 16 30 09   23 23 23 CB
16F0: C6 EB CB F6   C9 EB CB B6   FB C9 00 00   00 00 00 00
1700: 21 A7 24 CB   46 28 32 CB   4E 20 0A DB   00 CB 5F C8
1710: CB CE 00 00   C9 23 7E CB   FB D3 04 DB   00 CB 5F C0
1720: 2B CB 86 CB   8E 23 7E E6   38 0F 0F 0F   6F 26 25 7E
1730: CB BF D3 04   D3 06 D3 07   C9 CB 4E DB   03 18 06 CB
1740: 7F C0 CB CE   C9 CB 7F C8   C3 60 25 00   00 00 00 00
1750: 00 00 00 00   00 00 00 00   00 00 00 00   00 00 00 00
1760: 00 00 00 00   00 00 00 00   00 00 00 00   00 00 00 00
1770: 06 00 21 AA   24 34 2B 34   23 7E E6 0F   FE 0A 38 0F
1780: 7E C6 06 77   FE D0 38 07   97 77 2B 77   23 06 FF 7E
1790: D3 03 DB 00   CB 67 20 DD   2B 2B 7E E6   07 4F 78 2F
17A0: A7 20 22 EB   79 C6 10 6F   26 25 46 79   C6 B0 6F 62
17B0: 70 79 FE 04   28 03 3C 18   01 97 4F C6   B0 6F 7E A7
17C0: 28 03 35 18   EC 26 25 79   C6 20 6F 7E   CB 27 CB 27
17D0: CB 27 B1 4F   21 AA 24 7E   D3 03 16 00   06 08 1F 30
17E0: 01 14 10 FA   79 06 06 1F   30 01 14 10   FA 1F CB 1A
17F0: 1F 37 1F 2B   2B 77 D3 04   2B 21 A7 24   36 01 C9 00
;
```

FLOW DIAGRAM                Navy Case 61,536

RESET START

MOVE MAIN PROGRAM AND JUMP TABLE TO RAM

INITIALIZE CONSTANTS AND CLEAR DATA TABLES

?EXTERNAL TERMINAL CONNECTED?

THEN ENTER MONITOR (RE-ENTER PROGRAM AT ANY OPERATOR-SELECTED POINT - - - USUALLY AT NEXT LINE)

BEGIN NORMAL OPERATION.................................

?JUMP-TO-MONITOR COMMAND (FROM PANEL SWITCHES)?

THEN ENTER MONITOR (RETURN TO ANYWHERE, AS ABOVE)

?ANY LED'S LIT CORRESPONDING TO OUT-OF-SERVICE CELLS?

THEN TURN THEM OFF

DEBOUNCE PANEL SWITCH INPUTS

?"ADVANCE" SWITCH PERSISTENTLY ON?

THEN GENERATE STREAM OF PULSES FOR FAST ADVANCE

?ALARM CONDITION?

THEN CYCLE LAMP AND HORN OUTPUT BUFFERS

?STATUS "COUNTING"?

?THEN DONE COUNTING YET?

?THEN RESPONSE QUALITY OK?

THEN AVERAGE NEW DATA WITH OLD DATA AND STORE BACK

ELSE STORE RESPONSE FAILURE EVENT

UPDATE LED DISPLAY ARRAY BUFFER

?MANUAL "CELL ADVANCE" COMMAND?

```
                        THEN INCREMENT MANUAL
                        DISPLAYED-CELL NUMBER
              ?DIGITAL CELL DISPLAY UNFROZEN?
              (FIRST NEW FAULT ON AUTO-DISPLAY
              OR MANUAL CELL DISPLAY?)
                    ?THEN "AUTO DISPLAY" STATUS?
                              THEN SET DISPLAYED-
                              CELL NUMBER TO CELL
                              JUST INTERROGATED
                         ELSE SET DISPLAYED-CELL
                         NUMBER TO MANUAL CELL #
                    PLUCK AND SCALE DATA
                    CONVERT TO BCD
                    CONVERT TO 7-SEGMENT DISPLAY
                    CODE
                    UPDATE DIGITAL DISPLAY BUFFER
              BEGIN SETUP NEXT INTERROGATED CELL...
                    ?DONE WITH LAST (#127) CELL?
                              THEN CHANGE TO NEXT
                              DATA TYPE
                              RESET TO CELL 00
                         ELSE ADVANCE TO NEXT
                         CELL
                    ?CELL OF OF SERVICE?
                         THEN END LOOP..............
                    START INTERROGATION
                    END LOOP................................
              ELSE END LOOP................................
         ?ELSE DONE INTERROGATING YET?
              THEN TURN OFF INTERROGATING SIGNAL
              WAIT (TO ALLOW TRANSPONDER TO TURN ON)
              START DEMODULATOR COUNTING CYCLE
    END LOOP.................................................
```

Interrupt-Driven Display Multiplex Program:

```
CLOCKED INTERRUPT START
TURN DISPLAY OFF
OUTPUT DATA FROM BUFFERS FOR NEXT-DISPLAYED COLUMN
TURN DISPLAY ON
RETURN TO INTERRUPTED POINT
```

The processor program described above causes the hardware to interrogate up to 125 cell transponders 10, average and store the responses from the transponders, display the stored data acquired from any selected cell, and automatically alarm in case the data reported from any cell exceeds preset limit values. In addition, a monitor program (PROM 0 above) has been included which permits the scanner/display 12 to be connected to an external data terminal (not shown in the drawing) via a terminal interface (also not shown). As noted in Table I, the external data terminal is assigned to the output data select signal and input data select signal corresponding to processor addresses 05 and 01 (hexidecimal), respectively. The implementation of the terminal interface is similar to the other interface circuits and should be obvious in view of the earlier description. Using an external terminal, an operator can use the monitor program to modify the stored program and data limit values, or to print out the stored data (if a printer is included).

Upon system turn-on (or external reset) the program is entered at address 0000. Control immediately jumps to the MAIN subroutine at 14AO (hexidecimal) which transfers most of itself and the table of constants and factors (at 14EO-15OF as given in Table II, below) to a swath of random-access memory (RAM) beginning at 24FO; this is done so that the MAIN sequence of subroutines can be altered by the operator if desired from an external terminal. The MAIN routine next checks for an external terminal and, if one is connected, branches to the MONITOR entry. If no terminal is connected, the MAIN program proceeds to normal operation of the Scanner/Display Unit. During operation the MAIN program periodically checks for a "jump-to-terminal" command which is defined as the combination of three events: the presence of a connected terminal, operation of the lamp-test pushbutton, and operation of the ADVANCE switch. This feature allows the operator to interrupt normal execution whenever desired. The MAIN program is reentered from the monitor by a "G2533" command.

TABLE II

| | | |
|---|---|---|
| 14EO | 18 | DEMOD COUNT, 0 |
| 14E1 | 18 | DEMOD COUNT, 1 |
| 14E2 | 18 | DEMOD COUNT, 2 |
| 14E3 | 20 | DEMOD COUNT, 3 |
| 14E4 | 20 | DEMOD COUNT, 4 |
| 14E5 | 20 | DEMOD COUNT, 5 |
| 14E6 | 20 | DEMOD COUNT, 6 |
| 14E7 | 28 | DEMOD COUNT, 7 |
| 14E8 | 28 | LOW VOLTAGE, COUNT LIMIT |
| 14E9 | 33 | HIGH VOLTAGE, COUNT LIMIT |
| 14EA | 15 | LOW SPECIFIC GRAVITY COUNT LIMIT |
| 14EB | 14 | HIGH TEMPERATURE COUNT LIMIT |
| 14EC | 01 | LOW CIRCULATION COUNT LIMIT |
| 14ED | FF | HIGH CIRCULATION COUNT LIMIT |
| 14EE | 01 | LOW SPARE COUNT LIMIT |
| 14EF | 00 | (UNUSED) |
| 14FO | 00 | VOLTAGE INTERROGATE SKIP # |
| 14F1 | 00 | SPECIFIC GRAVITY SKIP # |
| 14F2 | 00 | TEMPERATURE SKIP # |
| 14F3 | 00 | CIRCULATION SKIP # |
| 14F4 | 00 | SPARE SKIP # |
| 14F5 | 00 | (UNUSED) |
| 14F6 | 00 | (UNUSED) |
| 14F7 | 00 | (UNUSED) |
| 14F8 | 40 | LAMP BLINK RATE DIVIDE # |
| 14F9 | 00 | (UNUSED) |
| 14FA | 50 | HORN CYCLE RATE DIVIDE # |
| 14FB | FC | LAMP PATTERN |
| 14FC | D4 | HORN PATTERN, 0 |
| 14FD | 09 | HORN PATTERN, 1 |
| 14FE | FO | HORN PATTERN, 2 |
| 14FF | 00 | HORN PATTERN, 3 |
| 1500 | 07 | VOLTAGE REPLY DURATION |
| 1501 | 03 | SPECIFIC GRAVITY REPLY DURATION |
| 1502 | 02 | TEMPERATURE REPLY DURATION |
| 1503 | 02 | CIRCULATION REPLY DURATION |
| 1504 | 02 | SPARE REPLY DURATION |
| 1505 | 00 | (UNUSED) |
| 1506 | 00 | (UNUSED) |
| 1507 | 59 | VOLTAGE FACTOR |
| 1508 | 7F | VOLTAGE OFFSET, HIGH BYTE |
| 1509 | AO | VOLTAGE OFFSET, LOW BYTE |
| 150A | 1A | SPECIFIC GRAVITY FACTOR |
| 150B | 7D | SPECIFIC GRAVITY OFFSET, HIGH BYTE |
| 150C | 00 | SPECIFIC GRAVITY OFFSET, LOW BYTE |
| 150D | 04 | TEMPERATURE FACTOR |
| 150E | 00 | TEMPERATURE OFFSET, HIGH BYTE (NOT USED) |
| 150F | C8 | TEMPERATURE OFFSET, LOW BYTE |

The microprocessor is used to scan the front panel LED cell array 266 and digital readouts 264. The DISPLAY SCAN routine (1400-144A) is called in response to an interrupt derived by frequency division from the processor crystal clock (290 in FIG. 2).

In a many cell battery system, a disabled cell is often jumped out of the system. In the preferred embodiment, the transponder address signals are coupled from latch 224 to a logic means (not shown) which provides a signal on data bit 4 when input data select (000) is interrogated if the cell has been placed out-of-service by manually placing a pin in a cell-out-of-service plugboard (not shown). The pin couples the signal from the logic means to a latch means for input to the processor on data bit 4 (not shown). The CELL OUT routine (1450-1494) periodically checks to ensure that none of the front panel cell array LED's 266 corresponding to out-of-service cells is illuminated. This routine will have no effect on operation except when a cell is manually placed out-of-service by changing a pin in the cell-out-of-service plugboard.

The Scanner/Display controls (the lamp-test pushbutton 286 and the AUTO/MANUAL/ADVANCE switch 280) are debounced by the DEBOUNCE routine (1600-165B). This particularly important for the ADVANCE switch in order that a single (brief) switch depression always results in a single-cell advance. If the ADVANCE switch 280 is held down past a wait period, the DEBOUNCE routine outputs a stream of advance pulses, causing a fast advance of the manual cell display counter.

The XFER routine (1660-166E) simply moves the ADVANCE output from the DEBOUNCE routine to a different location for use by the DISPLAY EXEC routine (1570-15EF).

When an out-of-limit condition is sensed, the processor 200 lights the alarm lamp 268 and sounds the alarm horn 270. The CYCLE ALARM subroutine (1690-16F9) causes the lamp to flash on and off and the horn to sound a distinctive pattern. The lamp duty cycle, the horn pattern, and the rates of both are controlled by program constants and may be readily altered (see Table II).

The processor spends a major portion of the time in a wait loop, entered in the STANDBY subroutine (1700-1748), awaiting the completion of a response from the cell transponders 12. When a response is received, the QUALITY subroutine (0800-0832) is entered to test whether the received signal-to-noise ratio is adequate to provide valid data. If the quality is satisfactory, the STORE RESPONSE subroutine (0840-0949) is employed to average the received data with earlier data of the same type and received from the same cell. Any out-of-limit or transponder failure is next registered on the front-panel LED cell array 266 by the UP-DATE CELL ARRAY subroutine (0950-09A3). The INTERROGATE subroutine (1770-17FE) then proceeds to format a message interrogating the next active cell. When all cells have been polled for a particular type of data the interrogation routine selects the next data type and repeats the process. Provision is made to skip each of the various data types for from 1 to 255 scans so that the relative frequency of polling can be selected to suit the variability of the data. The requested reply duration for each of the data types can also be varied by a program parameter (see TABLE II).

Control of the digital display of cell parameters is provided by the DISPLAY EXEC subroutine (1570-1-5EF) in response to the AUTO/MANUAL/ADVANCE switch 280. Data for a selected (or alarming) cell is extracted from the data memory and scaled to real units (volts, specific gravity, or degrees of temperature) by the PLUCK AND SCALE subroutine (09B0-0A9D). The scaled values from the PLUCK AND SCALE subroutine are converted to decimal by the BCD subroutine (0AA0-0AF3) and thence to seven-segment codes for operating the digital LED displays by the LOAD DIGITS subroutine (OBOO-OBEF).

It can be seen for the foregoing description that the battery monitoring system of the present invention accomplishes the object of automatically monitoring the status of a many-cell battery system. The status may be displayed at a remote location and manual measurements are eliminated. The system permits the monitoring of all cells on a common pair of wires with the signals being coupled at frequencies of approximately 20 KHz to 120 KHz so that the interconnecting pair of wires may be simultaneously used in another frequency range. For example, in the case of shipboard systems, the voice-activated phone circuit may be used. Since all transponders are identical and interchangeable, inventory and servicing problems are simplified. The monitoring system is extremely flexible, permitting the sampling rate and data accuracy to be changed as required without hardware changes of any kind. Any sensor which provides a DC voltage representing the parameter measured may be used in the system.

Obviously many modifications and variations of the present invention are possible in light of the above teachings. It is therefore to be understood that within the scope of the appended claims the invention may be practiced otherwise than as specifically described.

What is claimed is:

1. A system for automatically monitoring a plurality of parameters of a plurality of cells in a many-cell battery system, which comprises:
   a. a plurality of transponder means responsive to a frequency pattern corresponding to a digital command, each transponder means having a unique address associated with each of said plurality of cells for providing a signal having a frequency related to a selected one of said parameters, said transponder means including:
   b. a plurality of sensor means for measuring said plurality of parameters, each said sensor means providing an analog signal having an amplitude related to the value of one of said parameters;
   c. means for converting an analog signal to a signal having a frequency related to the amplitude of said analog signal; and
   d. means responsive to said frequency pattern for selectively coupling one of said plurality of analog signals to said means for converting an analog signal; and
   e. scanner/display means for providing said frequency pattern corresponding to a digital command to each of said transponders to selectively couple one of said plurality of analog signals to said means for converting in a selected one of said transponders, said scanner/display means being responsive to said signal having a frequency related to the value of said parameter for providing a visual indication of operational status of plurality of cells.

2. The system as recited in claim 1 wherein said scanner/display means includes:
   a. means for providing a visual display of the value of said parameter;
   b. means for converting said signal having a frequency related to the value of said parameter to a count, said count being related to the value of said parameter; and
   c. means responsive to said count for controlling said means for providing a visual indication.

3. The system as recited in claim 1 wherein said scanner/display means includes:
   a. programmable processor means, responsive to a count related to the frequency of said signal having a frequency related to the value of said parameter, for operating on said count to provide a first digital signal related to the value of said parameter, said processor means further providing a second digital signal containing a command for selectively coupling one of said plurality of analog signals to said means for converting in a selected one of said transponders;
   b. means for converting said signal having a frequency related to the amplitude of said analog signal to said count related to the value of said parameter;
   c. means for converting said second digital signal to a signal having said frequency pattern corresponding to said second digital signal;
   d. means responsive to said first digital signal for providing a visual display of the status of said parameter.

4. The system as recited in claim 3 wherein said second digital signal includes a first plurality of binary digits corresponding to a transponder address, a second plurality of binary digits corresponding to a selected sensor means, and a third plurality of binary digits corresponding to a reply duration command; and wherein said transponder means includes:
   a. discriminator means for converting said frequency pattern to a third digital command containing the selected transponder address, the selected sensor means, and the selected reply duration; and
   b. means responsive to said third digital command for coupling the analog signal from the selected sensor means to said means for converting an analog signal to a signal having a frequency related to the amplitude of said analog signal, said means for converting being enabled for a time period selected by the reply duration command.

5. A system as recited in claim 4 wherein said means responsive to said third digital command comprises:
   a. address recognizer means coupled to said discriminator means to receive said third digital command for decoding the selected transponder address portion of said digital command;
   b. command distributor means coupled to said address recognizer means to receive said selected sensor means and selected reply duration portions of said digital command when the selected transponder address corresponds with the address of said transponder, said command distributor decoding the selected sensor means portion of said third digital command to provide a plurality of control signals and decoding the selected reply duration command to provide an additional control signal having a duration equal to the select reply duration; and c. multiplexer means having a plurality of input channels coupled to receive said plurality of analog signals and an output channel, the control inputs of said multiplexer being coupled to said plurality of control signals from said command distributor means for selectively coupling one of said input channels to said output channel;

d. voltage-controlled oscillator means coupled to the output of said multiplexer means for converting said analog output signal to a signal having a frequency related to the amplitude of said analog output signal, the operation of said multiplexer and said voltage-controlled oscillator being enabled by said additional control signal for the duration of said control signal.

* * * * *